US008750598B2

(12) United States Patent
Bonner et al.

(10) Patent No.: US 8,750,598 B2
(45) Date of Patent: Jun. 10, 2014

(54) WATERMARKING OF A 3D MODELED OBJECT

(75) Inventors: David Bonner, Paris (FR); Pierre Ouok Chane Moui, Bourg-la-Reine (FR)

(73) Assignee: Dassault Systemes, Velizy Villacoublay Cedex (FR)

( * ) Notice: Subject to any disclaimer, the term of this patent is extended or adjusted under 35 U.S.C. 154(b) by 183 days.

(21) Appl. No.: 13/196,483

(22) Filed: Aug. 2, 2011

(65) Prior Publication Data

US 2012/0051584 A1 Mar. 1, 2012

(30) Foreign Application Priority Data

Aug. 27, 2010 (EP) .................................... 10305922

(51) Int. Cl.
*G06K 9/00* (2006.01)
*G06T 15/00* (2011.01)

(52) U.S. Cl.
USPC ........................... 382/154; 382/100; 345/419

(58) Field of Classification Search
USPC ................... 382/100, 154; 345/419
See application file for complete search history.

(56) References Cited

U.S. PATENT DOCUMENTS

| 6,201,881 B1 * | 3/2001 | Masuda et al. ................ 382/100 |
| 7,873,237 B2 * | 1/2011 | Grimaud et al. ............... 382/276 |
| 2009/0303235 A1 * | 12/2009 | Maekawa et al. ............ 345/423 |

FOREIGN PATENT DOCUMENTS

WO WO 2009107982 A1 * 9/2009

OTHER PUBLICATIONS

Benedens et al., "Geometry-based watermarking of 3D models", IEEE Computer Graphics and Applications, pp. 46-55, Jan. 1999.*
Zhang et al., "A mesh watermarking approach for appearnace attributes", Proceedings of the 10th Pacific Conference on Computer Graphics and Applications 2002, pp. 450-451, 2002.*
Kwon et al., "Watermarking for 3D polygonal meshes using normal vector distributions of each patch", ICIP 2003, pp. II499-II502, Sep. 2003.*
Cho, Wan-Hyun, et al., "Watermarking Technique for Authentication of 3-D Polygonal Meshes," *IWDW 2004*, 3304:259-270 (2005); (Digital Watermarking: Third International Workshop, Seoul, Oct. 30-Nov. 1, 2004).
Ohbuchi, R., et al., "Watermarking Three-Dimensional Polygonal Models," *Proceedings ACM Multimedia 97*, 5:261-272 (Nov. 1997).
Wang, K., et al., "A Comprehensive Survey on Three-Dimensional Mesh Watermarking," *IEEE Transactions on Multimedia*, 10(5):1513-1527 (Dec. 2008).
European Search Report; European Application No. EP 10 30 5922; Date of Search: Dec. 8, 2010 (10 pages).
European Partial Search Report; European Application No. EP 10 30 5922; Date of Search: Dec. 8, 2010 (6 pages).
Phong, Bui Tuong, "Illumination for Computer Generated Pictures," *Communications of the ACM*, 18(6):311-317 (Jun. 1975).
Blinn, J.F., "Simulation of Wrinkled Surfaces," *ACM SIGGRAPH*, 12(3):286-292 (Aug. 1978); (SIGGRAPH '78 Proceedings of the 5th annual conference on Computer Graphics and Interactive Techniques, 1978).

* cited by examiner

*Primary Examiner* — Anand Bhatnagar
*Assistant Examiner* — Soo Park
(74) *Attorney, Agent, or Firm* — Hamilton, Brook, Smith & Reynolds, P.C.

(57) ABSTRACT

A method is provided for designing a 3D modeled object comprising the steps of providing at least one surface defined by a field of points of the surface and a field of normal vectors normal to the surface; and watermarking the object by modifying the field of points while keeping the field of normal vectors as it is. Such a method provides a technique for tracing a 3D modeled object modeled at least by a field of points of a surface and a field of normal vectors normal to the surface.

13 Claims, 4 Drawing Sheets

WATERMARKING OF A 3D MODELED OBJECT

RELATED APPLICATIONS

This application claims priority under 35 U.S.C. §119 or 365 to Europe, Application No. 10305922.6, filed Aug. 27, 2010.

The entire teachings of the above application are incorporated herein by reference.

FIELD OF THE INVENTION

The invention relates to the field of computer programs and systems, and more specifically to a method, system and program for designing a 3D modeled object.

BACKGROUND

Computer-aided techniques are known to include Computer-Aided Design or CAD, which relates to software solutions for authoring product design. Similarly, CAE is an acronym for Computer-Aided Engineering, e.g. it relates to software solutions for simulating the physical behavior of a future product. CAM stands for Computer-Aided Manufacturing and typically includes software solutions for defining manufacturing processes and operations.

A number of systems and programs are offered on the market for the design of objects (or parts) or assemblies of objects, forming a product, such as the one provided by Dassault Systemes under the trademark CATIA. These CAD systems allow a user to construct and manipulate complex three dimensional (3D) models of objects or assemblies of objects. CAD systems thus provide a representation of modeled objects using edges or lines, in certain cases with faces. Lines or edges may be represented in various manners, e.g. non-uniform rational B-splines (NURBS). These CAD systems manage parts or assemblies of parts as modeled objects, which are mostly specifications of geometry. Specifically, CAD files contain specifications, from which geometry is generated, which in turn allow for a representation to be generated. Geometry and representation may be stored in a single CAD file or multiple ones. CAD systems include graphic tools for representing the modeled objects to the designers; these tools are dedicated to the display of complex objects—the typical size of a file representing an object in a CAD system being in the range of one Megabyte per part, and an assembly may comprise thousands of parts. A CAD system manages models of objects, which are stored in electronic files.

Also known are Product Lifecycle Management (PLM) solutions, which refer to a business strategy that helps companies to share product data, apply common processes, and leverage corporate knowledge for the development of products from conception to the end of their life, across the concept of extended enterprise. By including the actors (company departments, business partners, suppliers, Original Equipment Manufacturers (OEM), and customers), PLM may allow this network to operate as a single entity to conceptualize, design, build, and support products and processes.

Some PLM solutions make it for instance possible to design and develop products by creating digital mockups (a 3D graphical model of a product). The digital product may be first defined and simulated using an appropriate application. Then, the lean digital manufacturing processes may be defined and modeled.

The PLM solutions provided by Dassault Systemes (under the trademarks CATIA, ENOVIA and DELMIA) provides an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Such PLM solutions comprise a relational database of products. The database comprises a set of textual data and relations between the data. Data typically include technical data related to the products said data being ordered in a hierarchy of data and are indexed to be searchable. The data are representative of the modeled objects, which are often modeled products and processes.

For designing a 3D modeled object, it is usually provided at least one surface which is to represent a physical boundary of the modeled object. The rendering of the 3D modeled object processes two fundamental quantities which usually define the surface: points of the surface and normal vectors of the surface (i.e. vectors which are normal to the surface). The points of the surface are usually provided as a set of 3D coordinates of the points on the object surface. Application of the projection and view matrices to such coordinates will give the position of a pixel on the computer screen. A normal vector is often provided as a 3D vector which is associated to a point of the object surface. This vector, also called the "normal", controls the reflection of light from the surface, and, together with the material properties, will define the color of the resultant pixel. The following may also refer to a normal field, which is defined as the function that gives a normal for each position on the 3D object surface. FIG. 1 shows an example of a surface S for which normal vectors N are represented as arrows normal to the surface, the base of the arrows being points P of the surface S.

Geometric theory would suggest that it is sufficient to only model position in order to model a 3D object that is to be rendered, since the normal can be calculated from the derivatives of the position. In practice, however, many computer graphics systems provide for separate channels for position and normal, because it is more efficient to represent position data at a low resolution, and to represent local features such as sharp edges and surface roughness via variations in the normal field.

A common means of displaying 3D objects is the so-called "Phong shading", described e.g. in a paper by Bui Tuong Phong entitled "Illumination for Computer Generated Pictures," Comm. ACM, Vol 18(6):311-317, June 1975. In this approach, the system maintains a mesh of triangles, with separate positions and normals defined at each mesh vertex. Given a point on the surface, the normal vector at that point is computed by weighted average of the normal at each of the triangles vertices, using as weights the barycentric position of the point in the triangle.

An improvement on the Phong model is the Normal Mapped or Bump Mapped model, first described in a paper by Blinn entitled "Simulation of wrinkled surfaces", ACM SIGGRAPH, 1978, and widely used today in applications such as video games. This uses a triangle mesh with 2D coordinates (u,v) at each mesh vertex. The (u,v) pair points to a 2D map called a "normal map" or "bump map". Given a point on the surface, the normal field first computes a (u,v) value by weighted average of the (u,v) at each of the triangles vertices, and then performs lookup in the normal map using this (u,v) value. The normal map will usually be represented by a 2D image of finite size, and the lookup operator will perform interpolation between pixels of the image to simulate the existence of a continuous mapping.

In yet another known example, position data is stored as NURBS surfaces. A normal field is associated to the NURBS as a normal map.

To sum up, known techniques allow for distinct position and normal information on the surface. While Phong shading produces a normal field that smoothly evolves with position, going from the normal of one vertex to the normal of another vertex, a Normal Map can include any amount of detail.

Product lifecycle information, including product configuration, process knowledge and resources information are typically intended to be edited in a collaborative way. Thus, modeled objects are more and more shared and submitted to copyrights infringements. For that reason, the need for a higher traceability of 3D modeled objects has appeared, in order to prove infringement or illegal copy of 3D models.

To increase the traceability of 3D modeled objects, the field of 3D watermarking (the watermarking of 3D objects in general) has been explored. The applications of such a technique are multiple, for example, we might want to mark an object with a code representing the original author, to prevent it from being reused without permission. Most 3D watermarking techniques have in common a perturbation in the local shape (in other words, the position of the surface points) of the 3D model to insert the desired information. The technique proposed to hide these perturbations, is generally to make them so small that they are undetectable to the naked eye. A good survey of 3D watermarking techniques is provided in the paper entitled "A comprehensive survey on 3 dimensional mesh watermarking", by Wang, Lavoué et al., IEEE Transactions on Multimedia, vol. 10, No. 8, December 2008. However, there is no watermarking technique specific to 3D modeled objects for which a field of normal vectors is present beforehand.

Thus there still remains a need for a technique for tracing a 3D modeled object modeled at least by a field of points of a surface and a field of normal vectors normal to the surface.

SUMMARY OF THE INVENTION

According to one aspect, the invention therefore provides a method for designing a 3D modeled object comprising the steps of providing at least one surface defined by a field of points of the surface and a field of normal vectors normal to the surface; and watermarking the object by modifying the field of points while keeping the field of normal vectors as it is.

In embodiments, the product lifecycle management system according to the invention may comprise one or more of the following features:
- the method further comprises a step of rendering a 3D representation of the modeled object according to the field of points;
- the step of rendering comprises computing a projection on the screen according to the field of points;
- the rendering further comprises shading the projection according to the normal vectors;
- the surface provided is a surface of another object, and the step of watermarking comprises extracting the field of points and extracting the field of normal vectors of the surface, modifying the field of points while keeping the field of normal vectors as it is, applying a surface defined by the modified field of points and the unmodified field of normal vectors to the object being designed, the object being designed thereby becoming a watermarked copy of the other object;
- the step of watermarking comprises the densification of the field of points and accordingly the densification of the field of normal vectors;
- the densification of the field of points comprises performing subdivisions, and the densification of the field of normal vectors comprises creating new normal vectors by interpolating previous normal vectors;
- the watermarking is performed following a scheme subjected to a watermark bit sequence;
- the method further comprises, after the step of watermarking, steps of determining a bit sequence according to the scheme followed by the watermarking, and comparing the determined bit sequence to the watermark bit sequence;
- the method further comprises a step of transforming the surface by modifying the field of points and modifying the field of normal vectors accordingly;
- at the step of watermarking the object, the field of points is modified locally or globally;
- the field of points corresponds to a triangular mesh, the field of normal vectors associates a vector to each of the vertices of the triangular mesh, and/or the field of normal vectors is a normal map with a lookup operator.

According to another aspect, the invention further proposes a computer-aided design system comprising means for storing at least one surface defined by a field of points of the surface and a field of normal vectors normal to the surface; and a graphical user interface suitable for designing a 3D modeled object with the above method.

According to another aspect, the invention further proposes a computer program comprising instructions for execution by a computer, the instructions comprising means for causing a computer-aided design system comprising means for storing at least one surface defined by a field of points of the surface and a field of normal vectors normal to the surface and a graphical user interface suitable for designing a 3D modeled object, to perform the above method.

According to another aspect, the invention further proposes computer readable storage medium having recorded thereon the above computer program.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

A system embodying the invention will now be described, by way of non-limiting example, and in reference to the accompanying drawings, where.

DETAILED DESCRIPTION OF THE INVENTION

Figure 2:
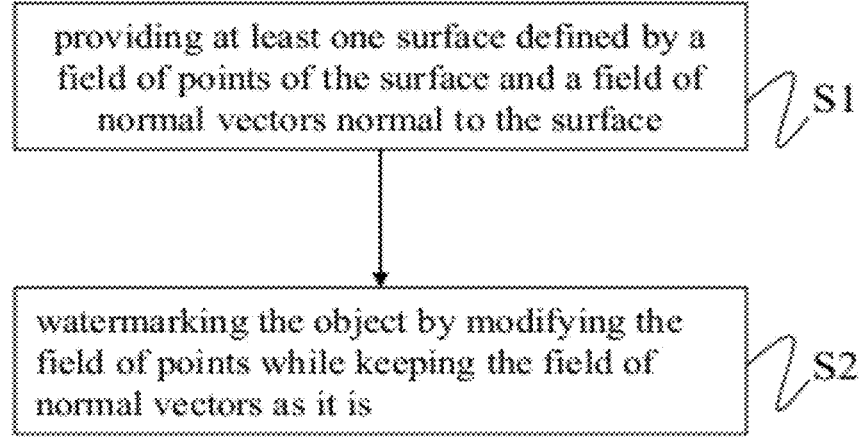
FIG. 2 shows a flowchart of an example of the method.

With reference to the flowchart of FIG. 2, it is proposed a method for designing a 3D modeled object. The method comprises a step S1 of providing at least one surface. The surface is defined by a field of points of the surface and a field of normal vectors normal to the surface. The method also comprises a step S2 of watermarking the object by modifying the field of points while keeping the field of normal vectors as it is. Such a method allows the traceability of a 3D modeled object modeled by a surface defined by a field of points and a field of normal vectors.

"Designing" an object means performing any action or combination of actions which modifies or creates a file comprising data modeling an object. Thus the method is intended for being performed on an object which has been previously created as well as creating a new object from scratch.

By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

Figure 1:
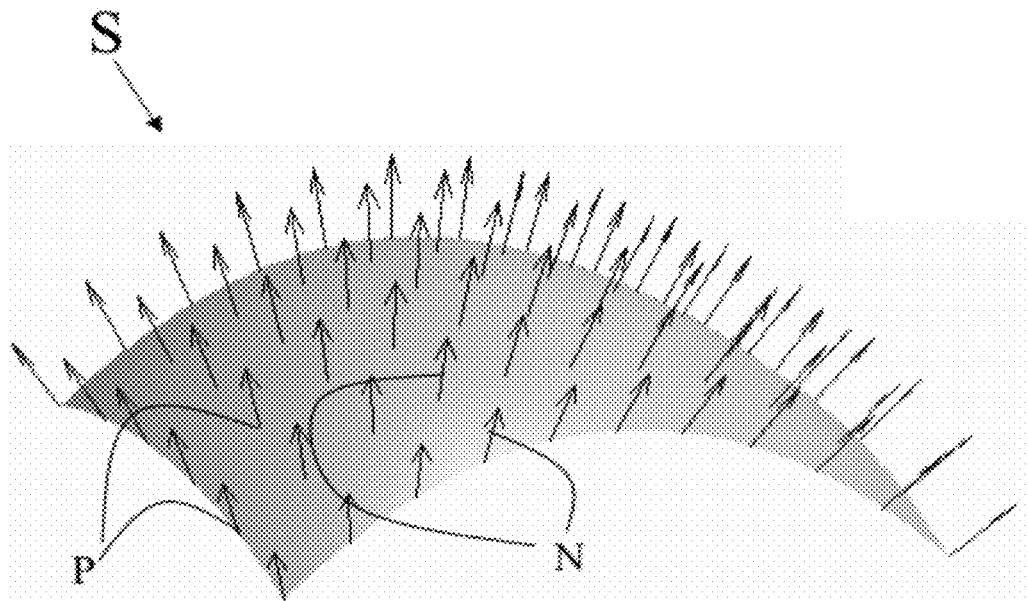
FIG. 1 shows an example of a surface.

In the method, the 3D modeled object is modeled by at least one surface, which is provided at step S1. The surface represents a boundary of the object. The surface may be the whole boundary of the object, or a part of the whole boundary of the object. In any case, the surface is defined by a field of points of the surface and a field of normal vectors normal to the surface, as for example the surface S is modeled by points P and normal vectors N on FIG. 1. By "field", it is meant any way of modeling a series of points/normal vectors. The fields may be series of coordinates, parametric definitions (for example a NURBS for the field of points), or a combination of both. The field of points and the field of normal vectors are linked in their values, e.g. according to any technique known per se such as Phong shading or the Bump Mapped model, so as to indeed define the same surface.

In examples, the field of points may correspond to a triangular mesh. This compatible with most CAD systems. In this case, the field of normal vectors may correspond to vectors associated to each of the vertices of the triangular mesh. In this case and other cases, the field of normal vectors may alternatively be a normal map with a lookup operator, as explained above.

Defining the surface by both a field of points and a field of normal vectors allows a more efficient rendering (i.e. the computation of the data for display) of the surface, i.e. a better memory usage Vs time needed to compute the rendering for a given level of details. Indeed, for rendering the surface, pixels (i.e. coordinates on the screen in addition to a color) are computed according to the field of points, as known per se, while shading (i.e. applying a coefficient to the color of a pixel, which enables the lighting up or the darkening of said pixel), as known per se but still described later, is performed according to the field of normal vectors. Thus, as a field of normal vectors defines the surface, it is not necessary to compute the normal vectors each time the surface is to be rendered with shading, which thus makes the rendering faster. Also, less information needs to be included to the field of points (i.e. the field of points needs to contain fewer points).

The method also comprises a step S2 of watermarking the object. In the present context, "watermarking" is a process of modifying the object in a way that, after modification, the object presents a set of features (which may be called "mark" or "watermark") that a random object which has not been watermarked is unlikely to present (the probability that a random object presents the watermark is less than x %, wherein x is a small value e.g. 1, 0.1, 0.01, 0.001, or even 0.0001). Thus, watermarking the object allows the traceability of the object. Indeed, a designer typically creates the object. Then, the designer may share the object for collaborative design purposes, or may publish it for the public to be able to use the object, or may sell the object. Before that, the designer watermarks the object according to the method. This way, if the object is reused in a way unauthorized by the designer, or if the object is sold even though this was not authorized by the designer, the designer may prove the infringement by identifying the watermark on the object with a level of probability higher that (100−x) %. This level depends on the watermarking process which is used, and may be rendered as high as desirable (only the absolute level of 100% being unreachable).

According to the method, the watermarking is performed by modifying the field of points while keeping the field of normal vectors as it is. Modifying the field of points means modifying the geometry by moving, removing some of and/or adding to the points. This ensures that the watermarking is not easily revertible. Notably, this ensures that the watermark cannot be removed by a single cut operation (unlike when a signature is simply appended to a file containing the object specifications).

The watermarking keeps the field of normal vectors as it is. In other words, unlike a usual design transformation of the surface, the watermarking does not modify the field of normal vectors. This diminishes the effect of the watermarking on the rendering. Indeed, as the field of normal vectors remains the same, the shading is not modified by the watermarking. Thus, the watermarking is statistically less visible to the human eye.

Figure 3:
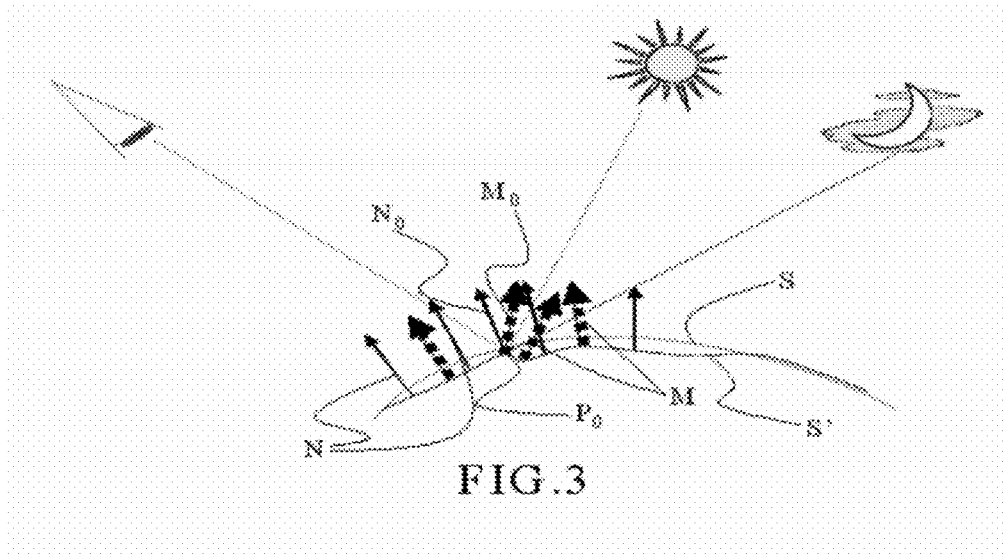
FIG. 3 shows an example of the execution of the method.

FIG. 3 provides an example of the above discussion. An initial surface S is provided, which is defined by a field of initial points, not represented on the figure, and normal vectors N, represented by full arrows. The object is watermarked by modifying the field of points while keeping the field of normal vectors N as it is. Because the field of points is modified, the geometry of surface S is modified. This is represented by surface S', which is the geometry of surface S after the watermarking. The field of normal vectors N is kept as it is. This is represented by the field of normal vectors N being transferred on surface S'. For the purpose of illustration, the field of the "real" normal vectors M (i.e. vectors which are geometrically really normal to the new surface S' according to the new geometry, the said real normal vectors M being obtainable by re-computing the field of normal vectors) is also represented, in dotted arrows. As can be seen, although initial surface S is a perfectly smooth arc of circle, the watermarking creates "bumps" in the new surface S'. For example, point $P_0$ of new surface S' (which is not necessarily a point of the field of points) is at the top of a bump. If the object is rendered using surface S' defined by the field of points as modified and the field of real normal vectors M, then point $P_0$ is represented by computing a level of shading applied to a pixel corresponding to point $P_0$, which depends on the angle formed by a position predefined as being the position of the eye and the real normal vector $M_0$. As can be seen in the example, the angle is relatively big, which implies that the level of shading applied is high, as if point $P_0$ was lighted up by the moon. The bump would thus become visible. However, because the field of normal vectors N is kept as it is by the watermarking, in fact the level of shading applied to the pixel corresponding to point $P_0$ is not as high because it is based on the angle formed by the position of the eye and the initial normal vector, which is relatively small. The level of shading is thus in fact as if the sun was lighting up $P_0$. The bump is thus not so visible in the rendering.

In fact, bumps created in the geometry of the surface by the watermarking are not reproduced on the field of normal vectors. The method thus provides a solution for visual "hiding" of watermarks where perturbations to the shape are potentially strong enough to be visible. Indeed, because the field of normal vectors is kept as it is, the watermarking may comprise performing important modifications on the field of points, without these modifications being visible. Keeping the field of normal vectors as it is allows the application of watermarks at much higher strength than would otherwise be possible. This increases the robustness to attack and the general reliability of the 3D watermarking approach. The robustness of a watermarking is its capacity to "resist" to transformations of the surface (i.e. the capacity of the watermark to remain).

The robustness of the watermarking may for example be such that, after the watermarking, if one performs designs on the model by transforming the surface, e.g. by modifying 20% (50%, 75% or 100% in other examples) of the positions of the points of the field of points according to a "regular" random walk (e.g. following a normal density function or any other probability function, i.e. the position at a time t+1 is the position at the time t plus u, wherein u is a vector of which coordinates are random variables following the density function N(0,1), wherein N is the normal density function), the watermark is still not erased. Such levels of robustness may be reached by methods known per se, e.g. the example of the method explained later.

Indeed, the method may further comprise a step of transforming the surface by modifying the field of points and modifying the field of normal vectors accordingly. Such a transformation is a design modification of the object performed by any designer working on the object. The more robust is the watermarking, the lower is the probability that a random transformation erase the watermarking. The method thus allows to watermark an object which is to be re-used and transformed by other designers.

Furthermore, because the watermarks are hidden, the watermarking may comprise modifying many points of the field of points (i.e. modifying the field globally), thereby making the erasing of the watermark very difficult. In such a case, the erasing of the watermarking may be so difficult to a potential infringer that the "benefits" of infringing would be lost. In examples, as many as 10%, 20%, 30%, 50% or even 75% of the points may be modified. Alternatively, the watermarking may be more local, i.e. the field of points is modified locally (i.e. points within a continuous area representing less than 10% of the points are modified). This allows the watermark to be less visible.

The principle of the method thus consists in re-applying to the marked model the normal field of the unmarked model. This means that the object carries all of the perturbations that allow the watermark to be read when necessary, but visually it looks as if it was not marked at all. The perturbations might remain theoretically visible on the silhouette (i.e. the projection on the screen according to the field of points of the model, without any shading), because the silhouette is a function only of the position data and not of the normal map. However it is a well known fact that details (local roughness, bumps) are far more noticeable in surfaces facing the viewer than on the object silhouette (as mentioned in the paper by Blinn dated 1978 and previously discussed). Modern video games make very wide use of this. For example, a monster covered in bumpy scales, for example, will be actually represented by a perfectly featureless body and a normal map containing the bumps. As the shape of the creature moves across the screen, the eye is drawn to the changes in reflection of light produced by the normal map, creating the illusion of a bumpy surface; the bumps are absent from the object silhouette, but the absence goes unnoticed. Correspondingly in the method, the watermark perturbations are hidden on the object surface facing the viewer, and only on the silhouette might some effect of the watermark remain visible.

The method may thus further comprise a step of rendering a 3D representation of the modeled object according to the field of points. The rendering may comprise computing a projection on the screen according to the field of points. This provides an unshaded representation of the object and allows a better visualization of the watermark. In the case the watermarking consists in "writing" a text tag, e.g. the name of the owner company, on the surface (e.g. using a color distinguishable from its direct surrounding on the surface or using a relief), such a rendering allows the reading of the text. However, the rendering may further comprise shading the projection according to the normal vectors. As the normal vectors are the ones before the watermarking (which were kept), such a rendering "hides" the watermarking to the human user.

Practically speaking, an object being designed may be watermarked by directly applying the above method to the file containing the specifications of the object, such as the definition of the surface (notably the field of points and the field of normal vectors). Alternatively, a copy of the file may be created for the watermarking purposes. Such a copy is there to be diffused. Thus, the method allows for designing a watermarked copy of a previously designed object. Strictly, to create an object which is a watermarked copy of another object, the surface provided is the surface of the other object. The step of watermarking thereby comprises extracting the field of points and extracting the field of normal vectors of the surface (from the file of that other object). The watermarking then comprises modifying the field of points while keeping the field of normal vectors as it is, as discussed above. Finally, the watermarking comprises applying a surface defined by the modified field of points and the unmodified field of normal vectors to the object being designed, the object being designed thereby becoming a watermarked copy of the other object.

The watermarking may comprise the densification of the field of points. The watermarking may further comprise accordingly the densification of the field of normal vectors. In other words, the number of points is increased, and new normal vectors may be computed according to the new points. In some cases, the original object is found not to have a sufficient number of characteristic points to be able to carry the watermark. In such cases, the original field of points can first be made denser, meaning that new points are inserted with or without changing the shape or the normal field. The global process remains the same, the only change being that the denser new field of points is the input instead of the original field of points.

The densification of the field of points may comprise performing subdivisions (e.g. Catmull-Clark or Loop subdivisions). The densification of the field of normal vectors may comprise creating new normal vectors by interpolating previous normal vectors. This allows the execution of the method with most CAD softwares, which usually allow such subdivisions and such interpolations.

The watermarking may be performed following a scheme subjected to a watermark bit sequence. The watermark is then the watermark bit sequence. In order to prove illegal use of the object, the reverse process may be performed on the object in order to determine a bit sequence. The determined bit sequence is then compared to the watermark bit sequence. If it is the same, then infringement is proved with a certain degree of probability depending on the watermarking scheme, as discussed above.

Figure 4:
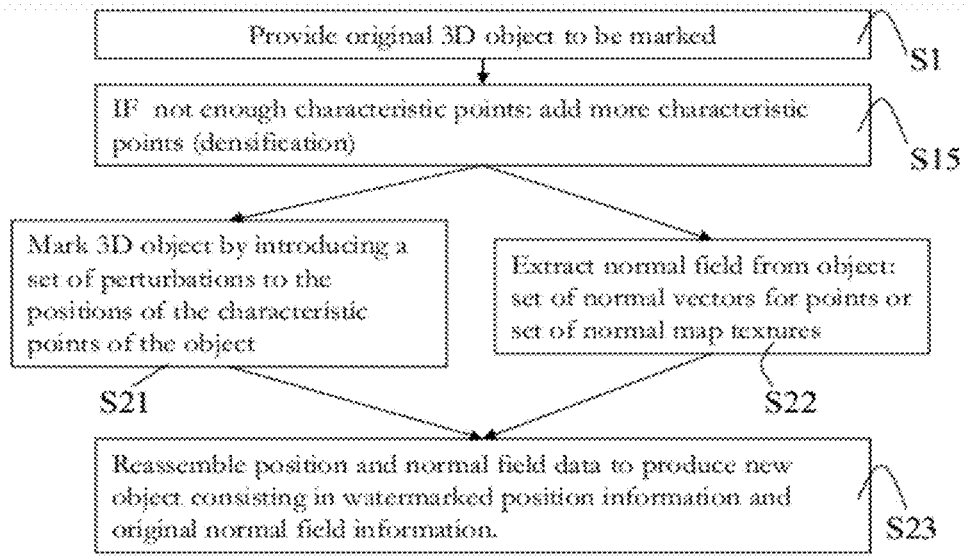
FIG. 4 shows a flowchart of an example of the method.

FIG. 4 shows an example of the method. In the example, the method comprises step S1 of providing the original object to be watermarked (which includes the surface of the object). The method then comprises a step S15 of testing whether or not there are enough points and adding new points should it be the case. The step of watermarking the object S21, S22 and S23 comprises introducing a set of perturbations to the positions of the characteristic points of the object, in parallel, extracting the normal field from the object, and after that reassembling position and normal field data to produce a new object consisting in the watermarked position information and original normal field information.

The method was tested by using a 3D watermarking technique introduced by W. H. Cho, M. E. Lee, H. Lim, and S. Y. Park, and described in a paper entitled "Watermarking technique for authentication of 3-D polygonal meshes" (Proc. of the International Workshop on Digital Watermarking '05, 2005, pp. 259-270"). More specifically, a watermark bit sequence of length L is provided. The center of gravity of the surface is computed. Then L concentric spheres $(S_1, \ldots, S_L)$ are created, e.g. such that the radius of the spheres $S_i$ follows an arithmetic sequence (alternatively, the radii may be such that there is the same number of points in each crown, as explained right below) and the largest sphere $S_L$ includes all the points of the field of points. The points are then grouped inside "crowns" $C_i$ wherein $C_1 = S_1$ and $C_i = S_i - S_{i-1}$ for i from 2 to L. Each crown corresponds to a respective bit $b_i$ of the watermark bit sequence. Then basically, the points within each crown $C_i$ are moved away from the center of gravity (e.g. if $b_i = 1$) or toward the center of gravity (e.g. if $b_i = 0$) inside the crown $C_i$. It should be noted that the points within a crown may be densified as explained above if there are not enough points inside the crown. Inversely, to verify if an object has been watermarked or not, the center of gravity is computed, L crowns are created as above, and for each crown a respective bit $d_i$ is determined to be equal to 1 if the points are for a majority "outside" (i.e. closer to the boundary of $S_i$ than $S_{i-1}$) or determined to be equal to 0 if the points are for a majority "inside" (closer to $S_{i-1}$). The so determined bit sequence may then be compared to the watermark bit sequence, and if it is the same, then it is determined that there is infringement with a probability $1-0.5^L$. More details are provided in the paper, e.g. as to how to move the points "away from" or "toward the" center of gravity, within a crown. Such a method offers a very robust watermarking, which resists to global transformations of the surface (such as an enlargement) as well as most local transformations, because the bit sequence is determined using the global data.

The result is that watermarks strong enough to be instantly visible if there is no shading in the rendering, are fully hidden by the use of the method (i.e. by shading the representation according to the field of normal vectors kept as it is before the watermarking). It was asked to a number of designers if they perceived or not a modification of the shaded silhouette, when comparing an object unmarked and the same object watermarked, both objects being rendered with shading. The potential effects on the shaded silhouette were imperceptible even to a trained eye.

The above method is computer-implemented, which means that the steps of the method are executed by a computer. However, the triggering of at least some of the steps of the method may be performed through user-computer interaction. The level of user-computer interaction required may depend on the level of automatism foreseen and put in balance with the need to implement the user's desideratum. In embodiments, this level may be user-defined and/or pre-defined.

Thus, the invention is also directed to a CAD system suitable for performing the method. In practice, a user is provided with a graphical user interface (or GUI) such as the one of CATIA, the GUI being in relation with a means, e.g. a database, for storing data necessary to the execution of the method.

Figure 5:
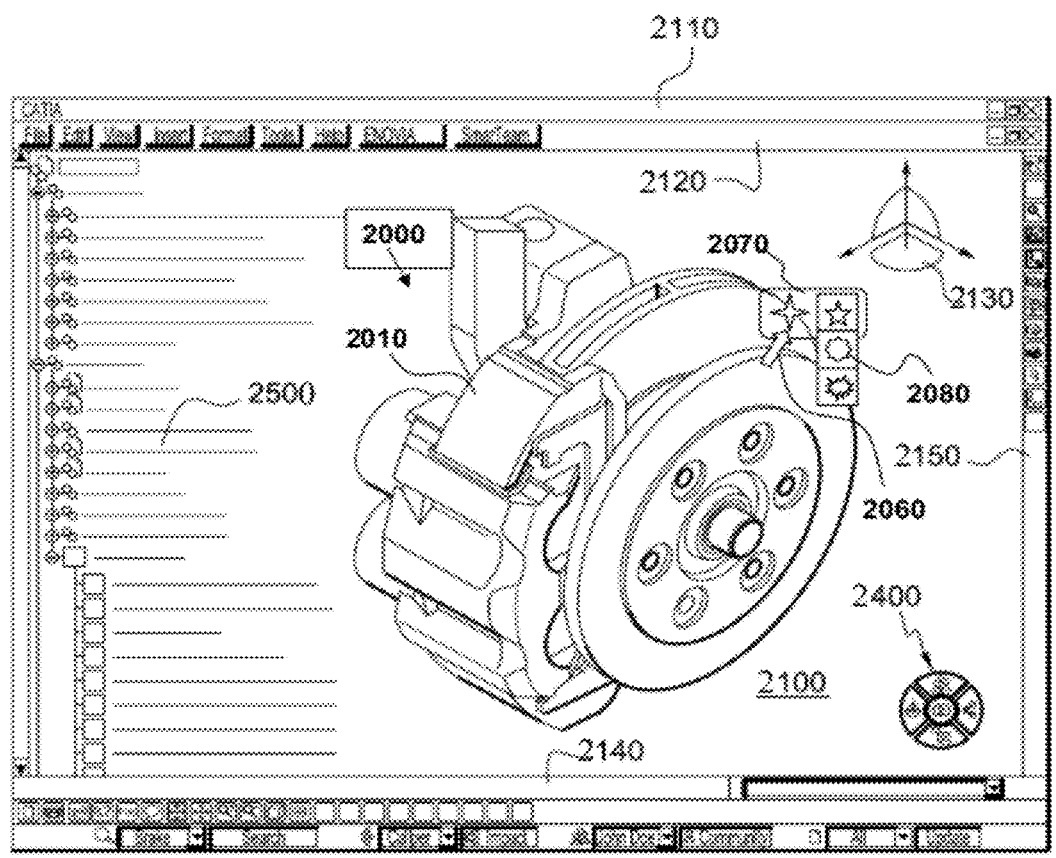
FIG. 5 shows a schematic example view of a graphical user interface adapted for carrying out the invention.

In reference to FIG. 5, the exemplified graphical user interface (or GUI) 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art.

Some of these icons are associated with software tools, adapted for editing and/or working on the 3D object which is a modeled product 2000 or parts of product 2000 such as that displayed in the GUI 2100. In the following description, "product", "part", "assembly" and the like may be referred to as "part" for the sake of simplicity. Note that the concept The concept of "part" can in fact be generalized to that of "object", wherein an object can be only a "physical" part of the designed product or, more generally, any software tool participating in the design process (but not necessarily "in" the final product).

The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of a 3D modeled object displayed on the screen.

The GUI may for example display data 2500 related to the displayed product 2000. In the example of FIG. 5, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

It is to be understood that the part 2000 can be any object in any configuration capable of being defined by a CAD/CAM/CAE system, or any system used to display views of an object from varying viewpoints. The invention may thus be implemented on a computer program comprising instructions by a computer, the instructions comprising means for causing the above system to perform the above method. The invention may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output.

The invention may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language.

Figure 6:
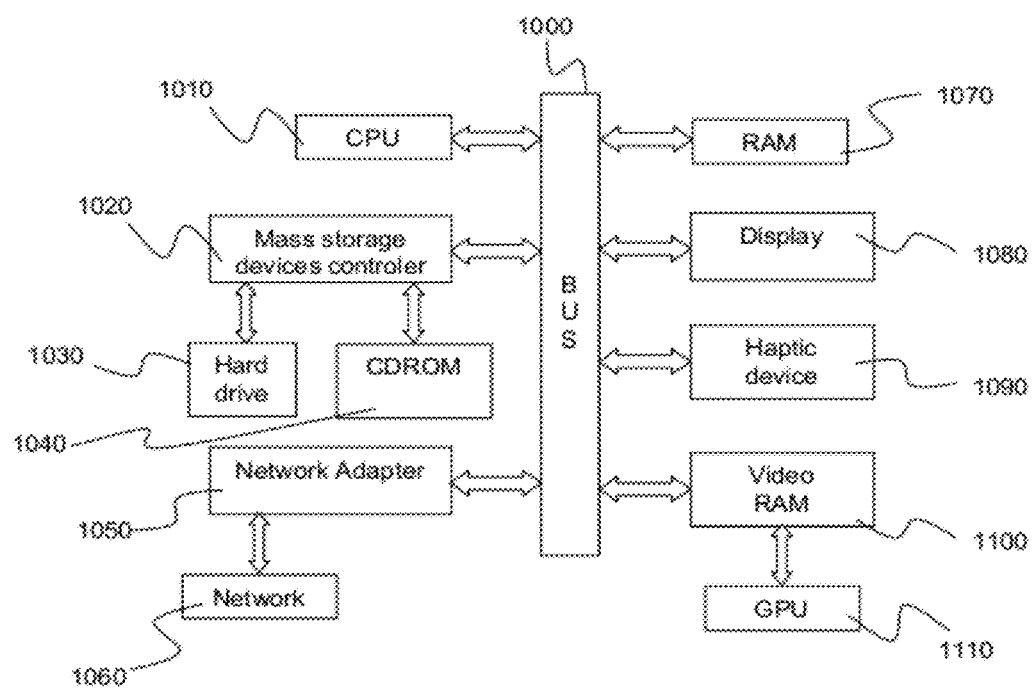
FIG. 6 shows a schematic example view of a system adapted for carrying out the invention.

FIG. 6 shows a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080, as mentioned with reference to FIG. 5. In addition, the cursor control device allows the user to select various commands, and input control signals. The cursor control device includes a number of signal generation devices for input control signals to system. Typically, a cursor control device may be a mouse, the button of the mouse being used to generate the signals.

While this invention has been particularly shown and described with references to example embodiments thereof, it will be understood by those skilled in the art that various changes in form and details may be made therein without departing from the scope of the invention encompassed by the appended claims.

The invention claimed is:

1. A method for designing a 3D modeled object comprising the steps of:
by a processor:
providing at least one original surface of the 3D modeled object defined by a field of one or more points of the surface and an original field of normal vectors normal to the original surface;
modifying the original surface by modifying a geometry of the field of one or more points such that at least one of the modified points is not on the original surface, thereby obtaining a modified surface characterized by a modified set of normal vectors normal to the modified surface; and
creating a watermarked version of the 3D modeled object defined by the modified surface and the original field of normal vectors.

2. The method of claim 1, further comprising a step of rendering a 3D representation of the modeled object.

3. The method of claim 2, wherein the step of rendering comprises computing a projection on a screen of a computer monitor.

4. The method of claim 3, wherein the rendering further comprises shading the projection according to the original field of normal vectors.

5. The method of claim 1, wherein the step of modifying the original surface by modifying a geometry of the field of one or more points is performed after a step of densification of the field of one or more points that produces a densified field of one or more points and densification of the field of normal vectors, and the step of watermarking modifies the densified field of one or more points.

6. The method of claim 5, wherein the densification of the field of one or more points comprises performing subdivisions, and the densification of the field of normal vectors comprises creating new normal vectors by interpolating previous normal vectors.

7. The method of claim 1, wherein the modifying the original surface is performed following a scheme subjected to a watermark bit sequence.

8. The method of claim 7, further comprising, after the step of modifying the original surface, steps of:
determining a bit sequence according to the scheme followed by the modifying the original surface, and
comparing the determined bit sequence to the watermark bit sequence.

9. The method of claim 1, further comprising a step of, after modifying the original surface, transforming the surface by modifying the field of one or more points and modifying the field of normal vectors accordingly.

10. The method of claim 1, wherein at the step of modifying the original surface, the field of one or more points is modified locally or globally.

11. The method of claim 1, wherein:
the field of one or more points corresponds to a triangular mesh,
the field of normal vectors associates a vector to each of the vertices of the triangular mesh, and/or
the field of normal vectors is a normal map with a lookup operator.

12. A computer-aided design system comprising:
memory storing at least one original surface of a 3D modeled object defined by a field of one or more points of the surface and an original field of normal vectors normal to original the surface; and
a graphical user interface configured for performing a method for designing the 3D modeled object, wherein the method comprises the steps of:
providing the original surface; and
modifying the original surface by modifying a geometry of the field of one or more points such that at least one of the modified points is not on the original surface, thereby obtaining a modified surface characterized by a modified set of normal vectors normal to the modified surface; and
creating a watermarked version of the 3D modeled object defined by the modified surface and the original field of normal vectors.

13. A non-transitory computer readable storage medium having recorded thereon a computer program comprising instructions for execution by a computer, the instructions causing a computer-aided design system to perform a method for designing a 3D modeled object, wherein the system comprises:
memory storing at least one original surface of the 3D modeled object defined by a field of one or more points of the surface and an original field of normal vectors normal to the original surface and
a graphical user interface,
and wherein the method comprises the steps of:
providing the original surface;
modifying the original surface by modifying a geometry of the field of one or more points such that at least one of the modified points is not on the original surface, thereby obtaining a modified surface characterized by a modified set of normal vectors normal to the modified surface; and creating a watermarked version of the 3D modeled object defined by the modified surface and the original field of normal vectors.

* * * * *